United States Patent
Niu et al.

(10) Patent No.: US 6,531,943 B2
(45) Date of Patent: Mar. 11, 2003

(54) BALUN-TRANSFORMER

(75) Inventors: Dow-Chih Niu, Taipei (TW); Chi-Yang Chang, TaoYuan Hsien (TW); Lih-Shiang Lin, Taipei (TW)

(73) Assignee: Chung Shan Institute of Science and Technology, Tao-Yuan (TW)

( * ) Notice: Subject to any disclaimer, the term of this patent is extended or adjusted under 35 U.S.C. 154(b) by 0 days.

(21) Appl. No.: 09/838,164

(22) Filed: Apr. 20, 2001

(65) Prior Publication Data

US 2002/0153984 A1 Oct. 24, 2002

(51) Int. Cl.[7] ............................................... H01F 27/28
(52) U.S. Cl. ......................... 336/182; 333/25; 333/26; 333/32; 343/859
(58) Field of Search ........................ 336/182; 333/25, 333/26, 32, 24 R; 343/859, 850

(56) References Cited

U.S. PATENT DOCUMENTS 5,061,910 A * 10/1991 Bouny ..................... 333/26
6,114,940 A * 9/2000 Kakinuma et al. ........ 336/233

* cited by examiner

Primary Examiner—Elvin Enad
Assistant Examiner—Jennifer A. Poker
(74) Attorney, Agent, or Firm—Birch, Stewart, Kolasch & Birch, LLP

(57) ABSTRACT

A balun-transformer, which is composed of a balun transition and an impedance matching circuit. Chemical etching is employed in the manufacturing process that is compatible with the common microwave circuit manufacturing process. Using the odd mode analysis and commercial microwave software to design the balun-transformer. It is more accurate and more efficient than the conventional method to make balun-transformer that it can only be designed by experience and experiments. These balun-transformers can be used in UHF and VHF band.

8 Claims, 7 Drawing Sheets

BALUN-TRANSFORMER

BACKGROUND OF THE INVENTION

1. Field of Invention

The present invention relates to a balun-transformer composed of a balun transition and an impedance matching circuit.

2. Related Art

The design of microwave circuits often need to convert from balanced lines to unbalanced lines and, at the same time, solve the problem of impedance matching. They are usually made according to experience and experiments. The most popular circuits with balun-transformer include the push-pull amplifiers and the sampling phase detectors.

Generally speaking, the following methods are often used to solve the above problems.

Coaxial-Line Type Balun-Transformer: Because of the good performance in power handling, it is often used in high power components. The coupling length is one fourth the wavelength at the usage frequency. The coupling length is already greater than three inches between 400 MHz and 500 MHz. It is too large to be realized in circuits. This type of transformer needs very good soldering technology to fix and ground it.

Ferrite-Toroid-Core Type Balun-Transformer: Its volume is smaller and can be put into the SMT package. The soldering technology is easier but the power handling capability is poor. Most of all, it has a higher cost.

SUMMARY OF THE INVENTION

In the actual design process of the disclosed balun-transformer, an odd mode analysis is first employed to design accurately and a commercial microwave software is then used to simulate.

The disclosed balun-transformer has two preferred embodiments. The first preferred embodiment chooses a conductor-backed coplanar waveguide (CBCPW) to conductor-backed coplanar stripline (CBCPS) transition to convert balanced line (CBCPW) to unbalanced line (CBCPS). An impedance matching circuit is designed following this CBCPW to CBCPS Transition. This kind of balun-trasfomer can be used from several MHz to 10 GHz.

A second preferred embodiment of the invention is a simplified form of the previous embodiment, wherein only the CBCPS is used. One node of its input port is grounded. The signal of the CBCPS output nodes is kept at a 180° phase difference. The impedance matching circuit is further employed. This simplified design can be used between several MHz and 2 GHz.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

The disclosed balun-transformer has two preferred embodiments, which are described hereinafter in further detail.

Figure 1:
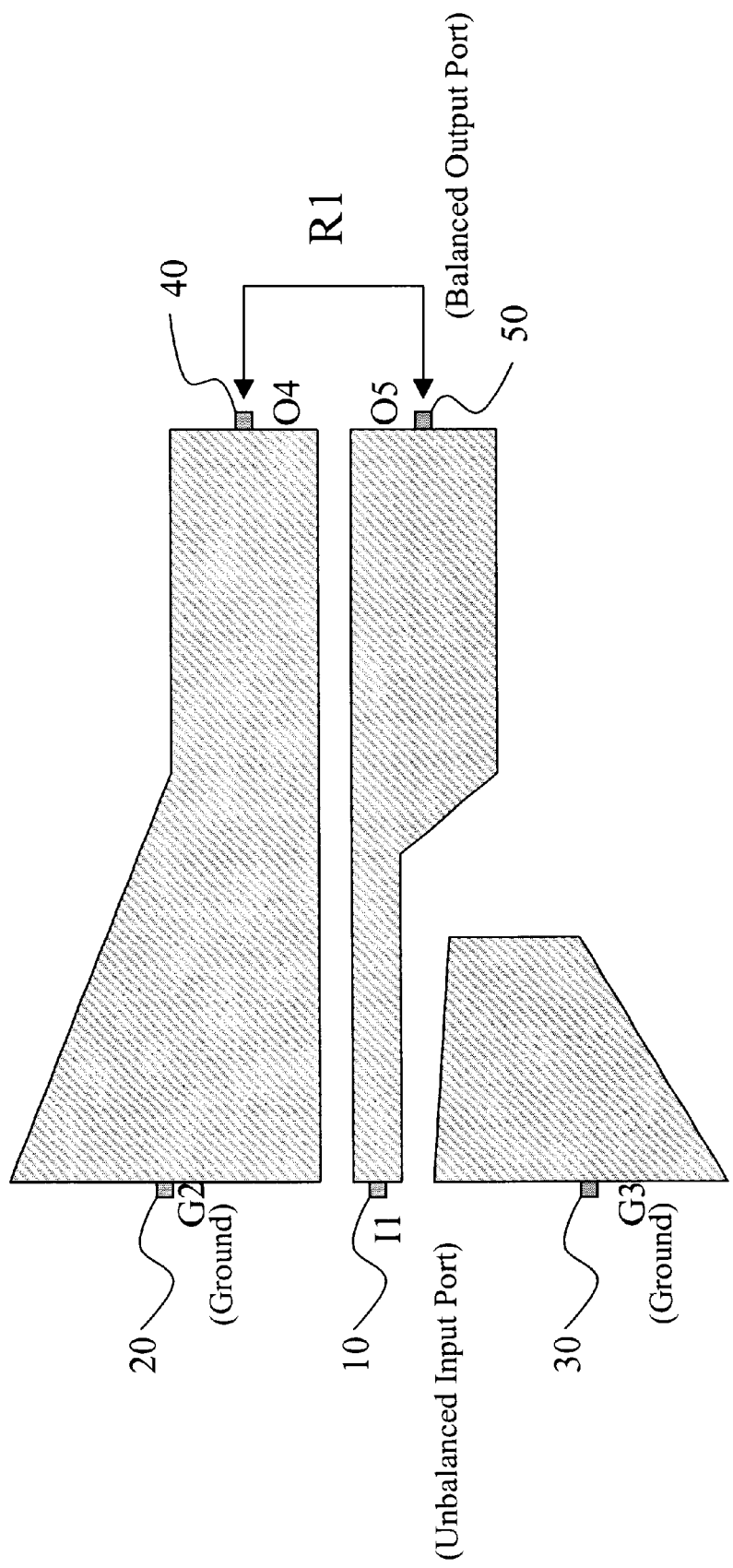
FIG. 1 shows the electromagnetic structure according to a first preferred embodiment of the invention.

With reference to FIG. 1, a conductor-backed coplanar waveguide (CBCPW) to conductor-backed coplanar stripline (CBCPS) transition is employed to convert a balanced line (CBCPW) to a unbalanced line (CBCPS). The impedance of the transition can be designed to have a constant value. Its output resistance R1 60 and system source resistance are usually 50Ω. The load impedance R2 70 on the other terminal is determined according to the devices used, and usually has an extremely low resistance.

Figure 2:
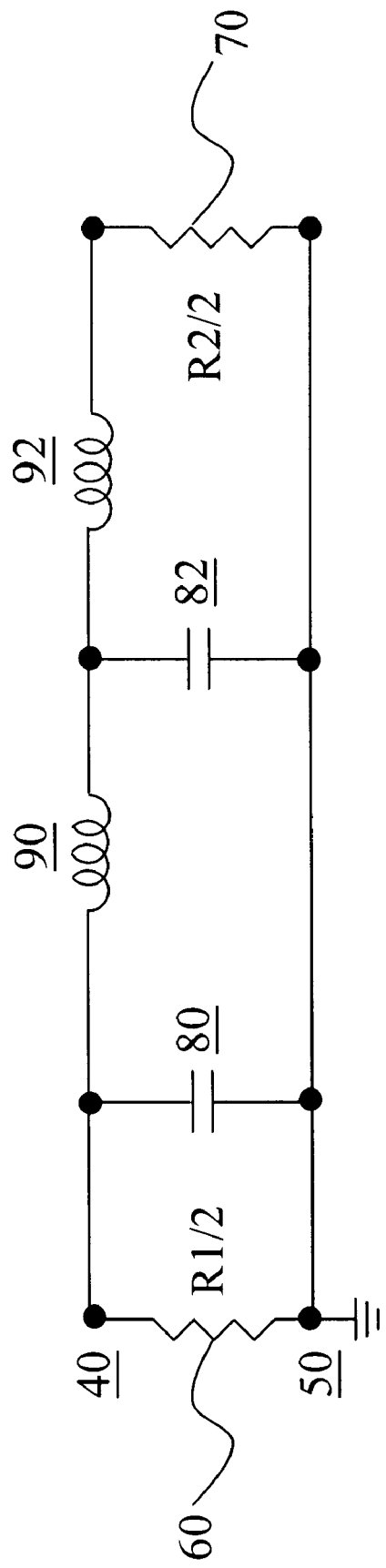
FIG. 2 shows the schematic diagram of the odd mode analysis method according to a first preferred embodiment of the invention.

According to FIG. 1, the input port is comprised by I1 10, G2 20, and G3 30. The I1 10 is signal node of the input port. G2 20,and G3 30 are the ground nodes of the input port. The signal between the CBCPS output nodes 04 40 and 05 50 is kept at a 180° phase difference. Using the odd mode analysis, the original circuit can be simplified into the circuit shown in FIG. 2. The ground is a RF virtual ground and the resistances R1/2 and R2/2 are half those of R1 and R2.

Figure 3:
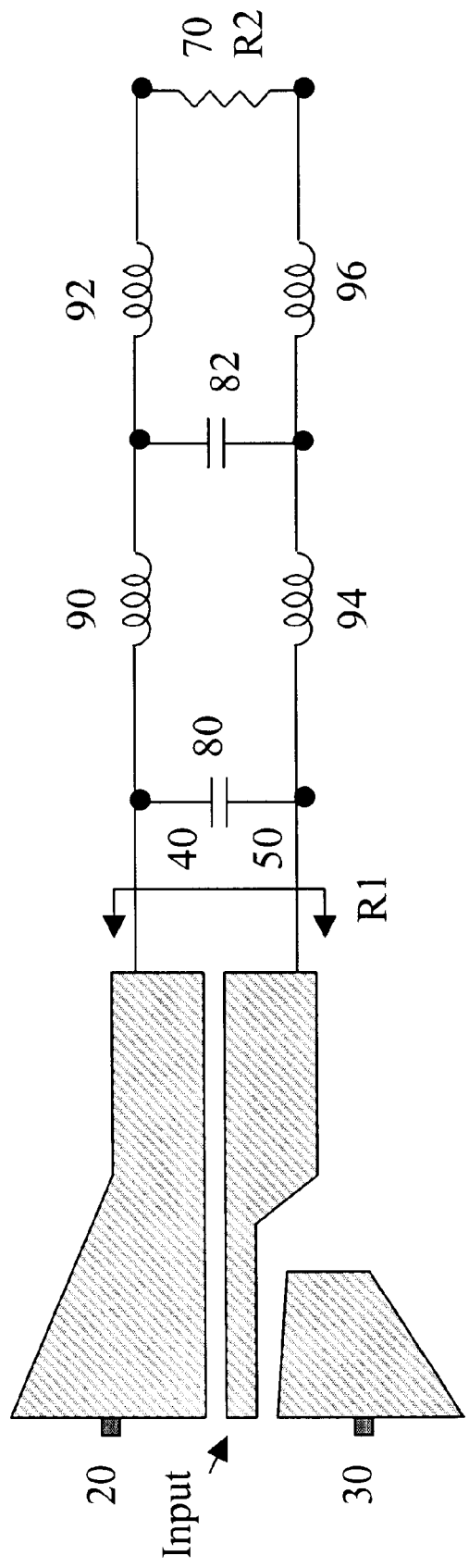
FIG. 3 shows the schematic diagram of the complete circuit structure according to a first preferred embodiment of the invention.

An impedance matching circuit composed of a first capacitor 80, a second capacitor 82, a first inductor 90 and a second inductor 92 is inserted between the half output resistor R1/2 and the half load resistor R2/2. The order of the matching circuit (N) can be any positive integer. Usually, the bigger the level N is, the wider the bandwidth is. For example, the bandwidth of the impedance ratio 8.5:1 can reach more than 50% when N=2. It can satisfy the most of the practical purposes. Finally, the obtained capacitance is divided by 2 and put in a symmetric structure between the output terminals 40, 50. The finally circuit is shown in FIG. 3. This balun-transformer works in the range between several MHz to 10 GHz.

Figure 4:
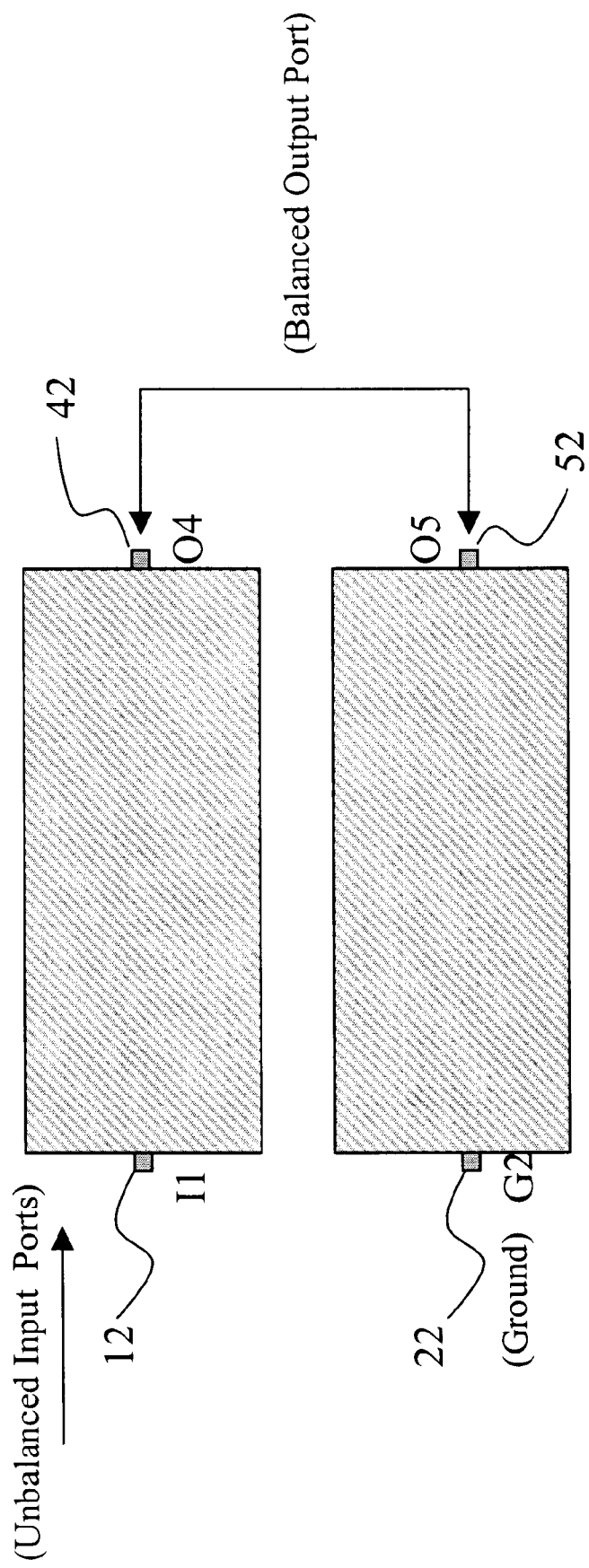
FIG. 4 shows the electromagnetic structure according to a second preferred embodiment of the invention.
Figure 5:
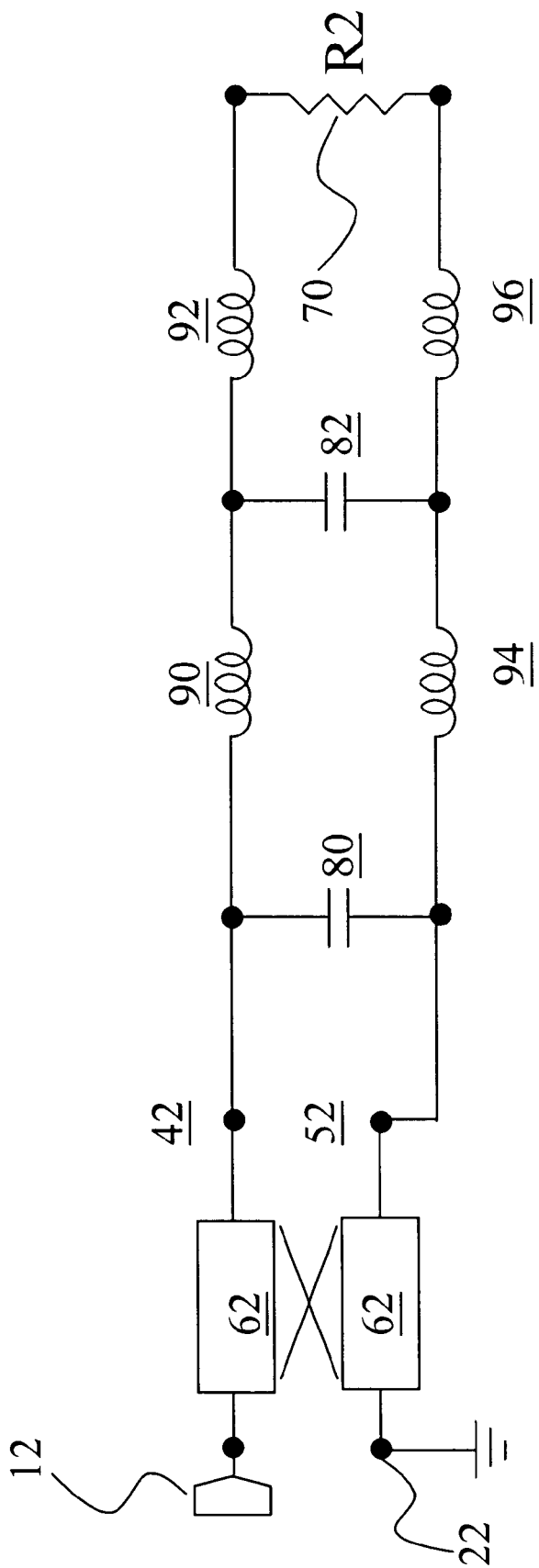
FIG. 5 shows the schematic diagram of the complete circuit structure according to a second preferred embodiment of the invention.

With reference to FIG. 4, a second preferred embodiment is obtained by removing the CBCPW from the electromagnetic structure of the first embodiment. It contains only the CBCPS. I1 is the input nodes 12 and the G2 terminal 22 is grounded. The signal between the CBCPS output nodes 04 42 and 05 52 is also kept at a 180° phase difference. Of course, the simplified transition impedance is changed. However, if the CBCPS length is far less than the wavelength used, the impedance becomes unimportant. There is no need to take care for the impedance. Instead of calculating impedance, The structure can be placed in commercial microwave simulation software, as shown in FIG. 5. A simple microstrip coupled line 62 model is used to replace the CBCPS. The simulation can give extremely good results by adjusting the first capacitor 80, the second capacitor 82, the first inductor 90, the second inductor 92, the third inductor 94, and the fourth inductor 96.

Figure 6:
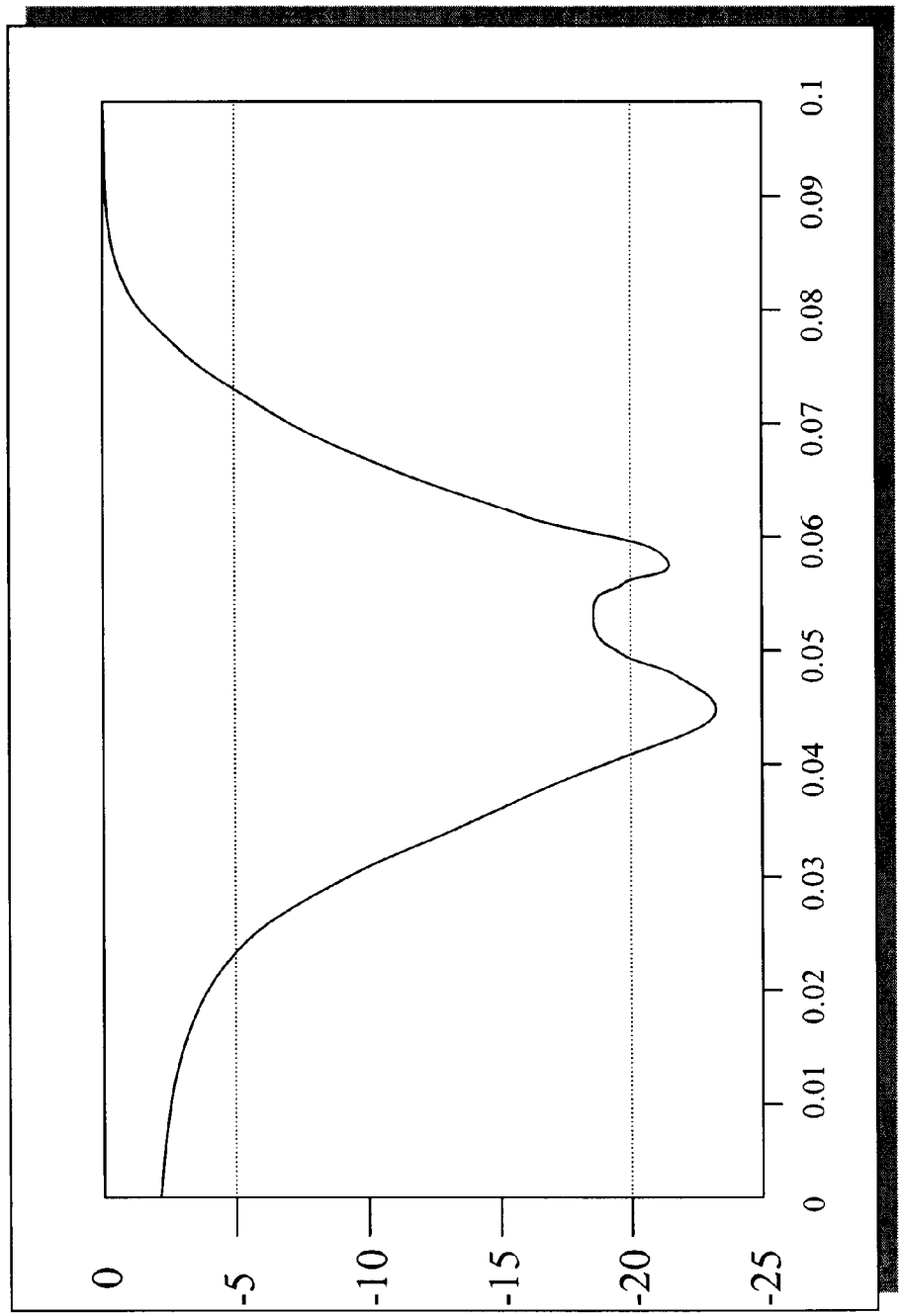
FIG. 6 shows the simulated return loss of the second preferred embodiment of the invention.

Using the above simulation result, a balun-transformer of order 2 with a central frequency of 50 MHz and the impedance transforming ratio of 8.5:1 is designed. FIG. 6 shows simulated return loss of the invention, and FIG. 7 shows measured return loss of the invention.

Figure 7:
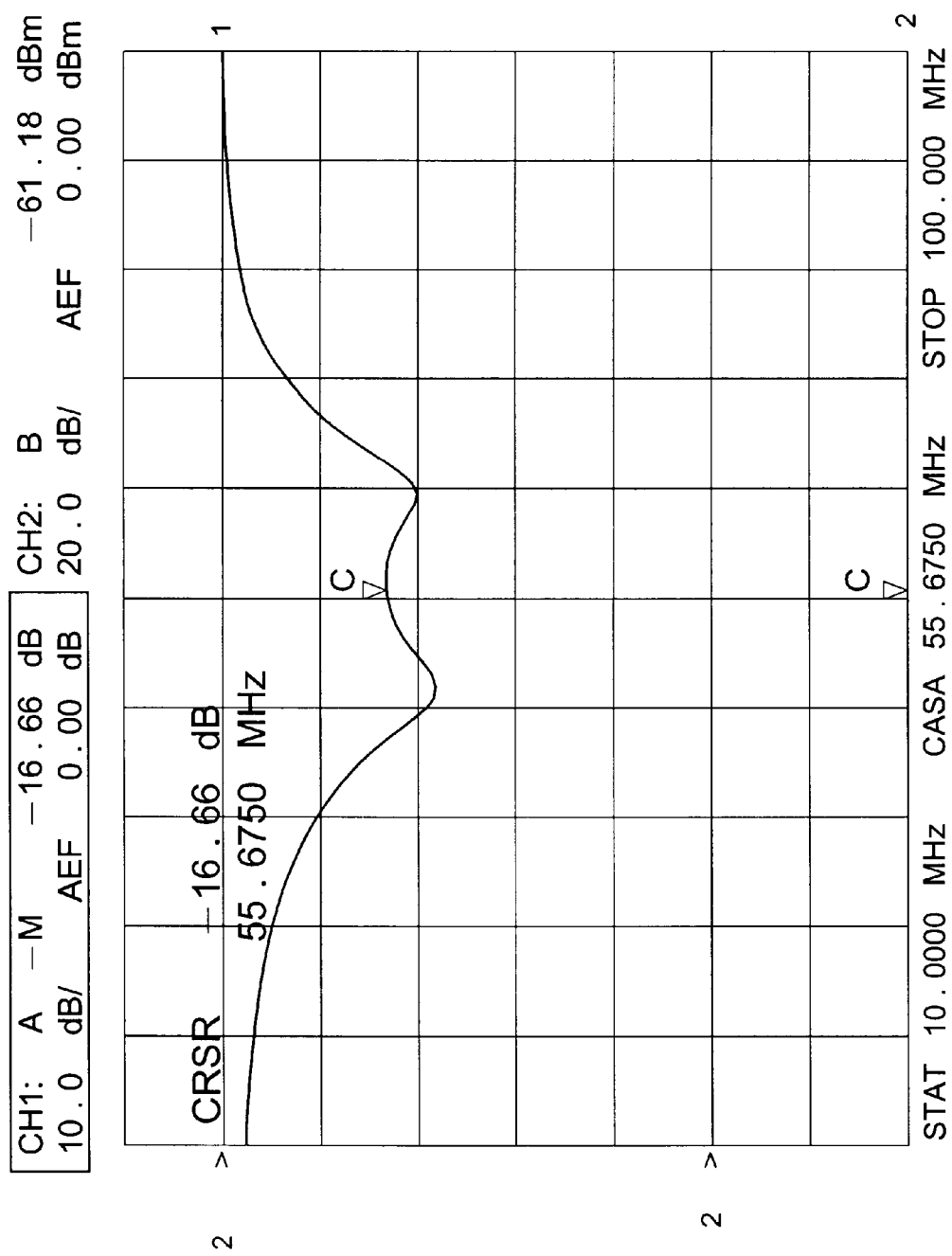
FIG. 7 shows the measured return loss of the second preferred embodiment of the invention.

From FIGS. 6 and 7, one sees that the simulated and measured results are pretty close. The return loss parameters are smaller than −18 dB and the bandwidths are close to 50%. The transformer is applicable in microwave circuits below 2 GHz. Since the transformer impedance is designed from 6Ω and 50Ω and impedance of the network analyzer ranges between 50Ω and 50Ω, the insertion loss cannot be measured. However, according to the law of energy conservation, if the return loss is greater than 18 dB, the capacitances Q are all greater than 50 and the current embodiment does not have any resistive element, the insertion loss should be smaller than 0.5 dB.

The above-mentioned two preferred embodiments disclose two kinds of balun-transformers applicable to very high frequency (VHF) and ultra high frequency (UHF) microwave circuits. The first preferred embodiment has a balun accompanied with an impedance matching circuit. The second embodiment is a simplified version of the first embodiment. In comparison with various methods used in the industry, its volume is smaller (irrelevant to the quarter wavelength) and its manufacturing-process only uses simple chemical etching, which is compatible with the common microwave circuit manufacturing processes. The present invention does not use a ferrite toroid core, thus greatly lowering the work time and manufacturing cost. Furthermore, the invention can work at a relatively large power, which depends on the working voltage and current of the matching capacitors and inductors respective.

In the actual design process, we first uses the odd mode analysis method to do an accurate design and then use commercial microwave software to do simulations. It is more accurate and more efficient than the conventional method to make balun-transformers that can only be design by experience and experiments.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A balun-transformer, which is manufactured by chemical etching accompanied with microwave circuit manufacturing processes and designed by the odd mode analysis and commercial simulation software, is comprising by:
   a unbalanced input port;
   a balanced output port;
   an impedance matching circuit to match a transition output resistance and a load resistance, wherein the impedance matching circuit includes: a first capacitor is connected to the balanced output node of a conductor-backed coplanar waveguide (CBCPW) to conductor-backed coplanar stripline (CBCPS) transition, both ends of the first capacitor and both ends of a second capacitor are inserted with a first inductor and a third inductor in series, and both ends of the second capacitor and both ends of the load resistor are inserted with a second inductor and a fourth inductor in series.

2. The balun-transformer of claim 1, wherein the applicable frequency range is in very high frequency (VHF) and ultra high frequency (UHF) band.

3. The balun-transformer of claim 1, wherein the order N of the balun-transformer can be any positive integer.

4. The balun-transformer of claim 1, wherein the balun-transformer uses a CBCPW to CBCPS transition as its electromagnetic structure.

5. A balun-transformer, which is manufactured by chemical etching accompanied with microwave circuit manufacturing processes and designed by the odd mode analysis and commercial microwave simulation software, is comprising by:
   a unbalanced input port;
   a balanced output port;
   an impedance matching circuit to match a transition output resistance and a load resistance, wherein the impedance matching circuit includes: a first capacitor is connected to the balanced output port of a conductor-backed coplanar stripline (CBCPS); both ends of the first capacitor and both ends of a second capacitor are inserted with a first inductor and a third inductor in series, respectively; both ends of the second capacitor and both ends of the load resistor are inserted with a second inductor and a fourth inductor in series, respectively; and one node of the CBCPS input port is grounded while the other node is the unbalanced input node.

6. The balun-transformer of claim 5, wherein the applicable frequency range is in VHF and UHF band.

7. The balun-transformer of claim 5, wherein the order N of the balun-transformer can be any positive integer.

8. The balun-transformer of claim 5, wherein the balun-transformer uses a CBCPS as its electromagnetic structure with one node of the CBCPS input port grounded.

* * * * *